United States Patent [19]

Meyer et al.

[11] Patent Number: 4,999,586

[45] Date of Patent: Mar. 12, 1991

[54] WIDEBAND CLASS AB CRT CATHODE DRIVER

[75] Inventors: Robert G. Meyer, Berkeley; Jeffrey D. Scotten, Roseville, both of Calif.

[73] Assignees: North American Philips Corp; Hewlett-Packard Co., New York, N.Y.

[21] Appl. No.: 198,950

[22] Filed: May 26, 1988

[51] Int. Cl.[5] .......................... H03F 1/26; H04N 5/14
[52] U.S. Cl. ................................... 330/288; 358/184; 307/542
[58] Field of Search ............... 330/288, 290, 310, 311; 358/181, 184; 307/540, 542, 567

[56] References Cited

U.S. PATENT DOCUMENTS

| | | | |
|---|---|---|---|
| 3,849,735 | 11/1974 | Haenen et al. | 330/252 |
| 3,869,568 | 3/1975 | Ueda et al. | 328/139 X |
| 3,922,585 | 11/1975 | Andrews | 315/389 |
| 4,114,109 | 9/1978 | Campioni | 330/267 |
| 4,118,731 | 10/1978 | Hinn | 358/184 X |
| 4,284,958 | 8/1981 | Pryor et al. | 330/253 |
| 4,314,167 | 2/1982 | Groves et al. | 307/540 |
| 4,429,283 | 1/1984 | Wittlinger | 330/257 |
| 4,727,336 | 2/1988 | Mark | 358/184 X |

FOREIGN PATENT DOCUMENTS

| | | |
|---|---|---|
| 0148563 | 7/1985 | European Pat. Off. |
| 2653624 | 7/1977 | Fed. Rep. of Germany |

OTHER PUBLICATIONS

Gilbert, "A New Wide-Band Amplifier Technique", *IEEE JSSC*, Dec. 1968, pp. 353-365.
Widlar, "Design Techniques for Monolithic Operational Amplifiers", *IEEE JSSC*, Aug. 1969, pp. 184-191.

*Primary Examiner*—Steven Mottola
*Attorney, Agent, or Firm*—David R. Treacy

[57] ABSTRACT

A wideband amplifier is configured to allow sophisticated low voltage signal processing in a low-cost, high frequency integrated circuit driver. The integrated circuit driver provides output currents to drive high voltage discrete power transistors in such a way as to achieve maximum frequency response from the low-cost discrete transistors. The discrete power transistors in turn provide an output voltage suitable for driving, for example, a CRT display. The transconductance amplifiers, video processing circuitry, current multipliers, and summers are formed in an integrated circuit device utilizing readily available processing and circuit design techniques, and a relatively small number of discrete low power components, including pull-up and pull-down transistors which are chosen to have a fairly high frequency of unity current gain ($F_t$), yet which are readily available at a very low cost. In order to utilize such low cost pull-up and pull-down transistors, these transistors are driven either in cascode or in a unity gain current mirror configuration from separate pull-up and pull-down currents, in order to avoid the deleterious effects the input base capacitance of the transistor has on its frequency response.

14 Claims, 3 Drawing Sheets

WIDEBAND CLASS AB CRT CATHODE DRIVER

BACKGROUND OF THE INVENTION

This invention pertains to video driver circuits and more particularly to a wideband class AB driver circuit suitable for receiving a video input signal and, in response thereto, driving a video display.

Prior art class A wide bandwidth amplifiers have been used to amplify video signals, with three such circuits required for color systems, one for each of the three primary colors red, green, and blue. Such prior art class A wide-band amplifiers are described, for example, in "A New Wide-Band Amplifier Technique", Barrie Gilbert, IEEE Journal of Solid-State Circuits, Vol. SC-3, pages 353–365, December 1968; "Design Techniques for Monolithic Operational Amplifiers", Robert J. Widlar, IEEE Journal of Solid-State Circuits, Vol. SC-4, No. 4, page 184–191, August 1969; and U.S. Pat. No. 3,849,735 issued Nov. 19, 1974 to Haenen et al. and assigned to U.S. Philips Corporation.

Of importance, such prior art wide bandwidth amplifiers used to amplify video signals are probably operated as class A amplifiers, in order to achieve fast pull-down and pull-up of the output voltage in response to changes in the input voltage, without the added cost and circuitry required to drive the amplifier in other than class A and to stabilize the output signal. Unfortunately, as is well known, class A amplifiers require a relatively large amount of power. Prior art class A video driver circuits configured as integrated circuits typically consume at least 2 watts of power for a black and white video image, or 2 watts per each of the three primary colors in a color video system.

Offenlegungsschrift 26 53 624 describes a prior art class AB amplifier used to amplify video signals in which the NPN pull-down output transistor is driven by a voltage applied to its base, and the NPN pull-up output transistor is connected as a totem pole, as is also described on page 884 of "Amplifying Devices and Low-Pass Amplifier Design", John Wiley & Sons, 1968. The disadvantages of this well known prior art circuit are the difficulty in interfacing it to a low voltage integrated circuit driver and the inferior frequency response which results from driving the base of the output transistors.

Of importance, such prior art wide bandwidth amplifiers used to amplify video signals are probably operated as class A amplifiers, in order to achieve fast pull-down and pull-up of the output voltage in response to changes in the input voltage, without the added cost and circuitry required to drive the amplifier in other than class A and to stabilize the output signal. Unfortunately, as is well known, class A amplifiers require a relatively large amount of power. Prior art class A video driver circuits configured as integrated circuits typically consume at least 2 watts of power for a black and white video image, or 2 watts per each of the three primary colors in a color video system.

Class B amplifiers have also been used to amplify video signals in the prior art. U.S. Pat. No. 4,114,109 issued to Campioni describes such a class B amplifier circuit. Unfortunately, the '109 circuit is rather complex and requires the use of a significant number of relatively large value capacitors, thereby precluding its fabrication as an integrated circuit. Furthermore, the '109 circuit drives discrete PNP and NPN output transistors by providing appropriate signals to their bases. By driving the bases of the output transistors, very high frequency output transistors must be used since the base capacitance of a transistor which is driven by a signal applied to its base adversely affects the usable frequency response of that transistor.

SUMMARY

In accordance with the teachings of this invention, a novel wideband amplifier is provided, which is suitable for use as a video amplifier. As one feature of this invention, the amplifier is operated in class AB, thereby affording a considerable savings in power consumption, as compared with prior art class A amplifiers. Furthermore, in accordance with the teachings of this invention, the amplifier provides lower radiated emissions, requires less printed circuit board area, and achieves a significantly better power supply noise rejection, than prior art wide band amplifiers. The wideband amplifier of this invention is configured to allow sophisticated low voltage signal processing in a low-cost, high frequency integrated circuit driver. The integrated circuit driver provides output currents to drive high voltage discrete power transistors in such a way as to achieve maximum frequency response from the low-cost discrete transistors.

In accordance with the teachings of this invention, a circuit is provided which allows for the input of a signal, typically a wideband signal such as a video signal, in any one of a desired number of formats, such as TTL or analog. Contrast and brightness signals are also applied as input signals to the circuit, which combines the wideband information, contrast, and brightness signals in order to provide a suitable output signal. When the circuit is used as a video circuit, the input data is a video signal, and the output signal of the low voltage integrated circuit driver is a current for driving the low-cost, high voltage discrete power transistors, which in turn provide an output voltage suitable for driving, for example, a CRT display.

In accordance with the teachings of this invention, a replica bias circuit is used which allows the output signal to be a function of the input signal without offsets introduced by bias currents used throughout the circuit.

In accordance with the teachings of this invention, the transconductance amplifiers, video processing circuitry, current multipliers, and summers are formed in an integrated circuit device utilizing readily available processing and circuit design techniques, and a relatively small number of discrete low power components, including pull-up and pull-down transistors which are chosen to have a fairly high frequency of unity current gain ($F_t$), yet which are readily available at a very low cost. In order to utilize such low cost pull-up and pull-down transistors, these transistors are driven either in cascode or in a unity gain current mirror configuration from separate pull-up and pull-down currents, in order to avoid the deleterious effects the input base capacitance of the transistor has on its frequency response.

DETAILED DESCRIPTION

Figure 1:
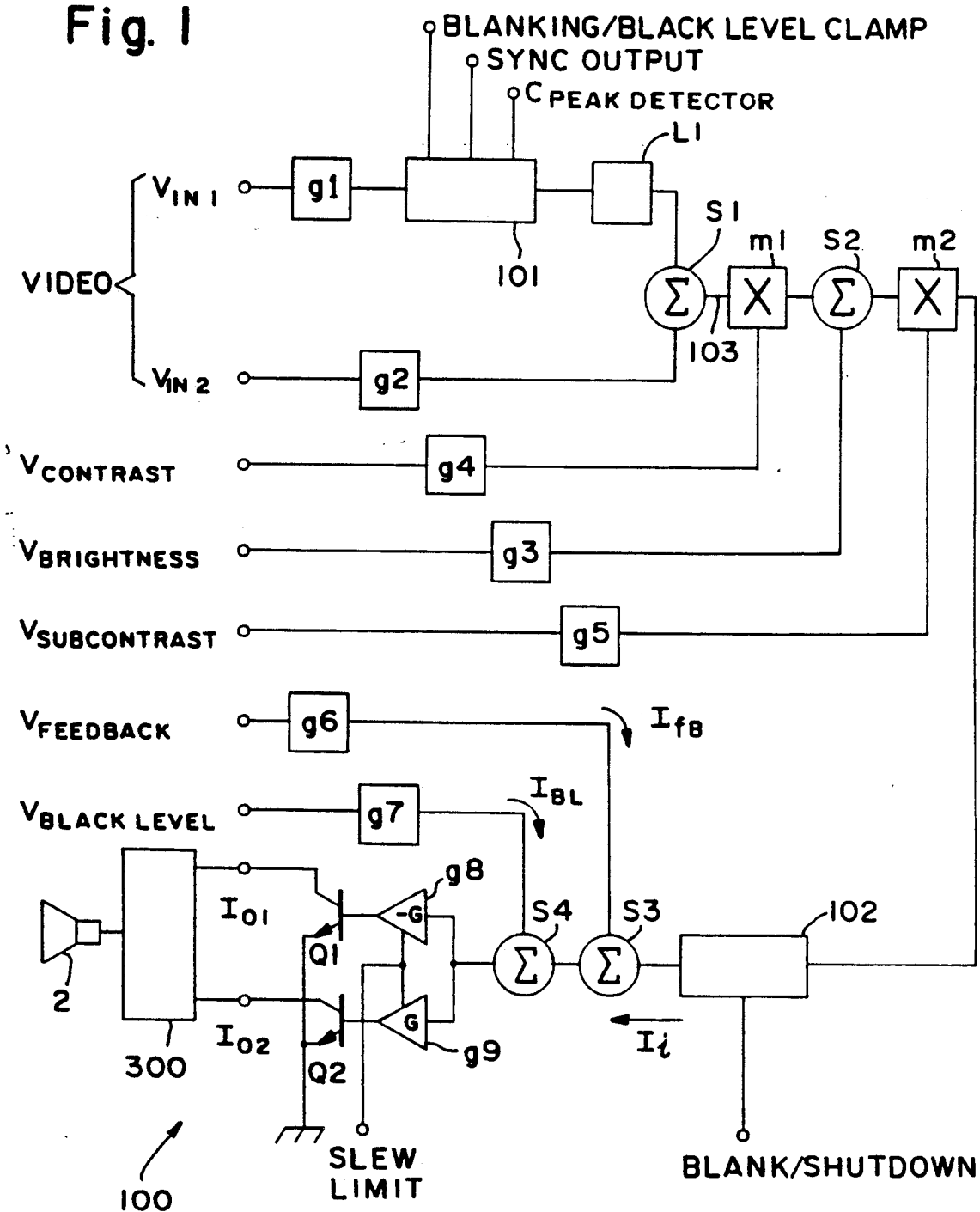
FIG. 1 is a block diagram of one embodiment of a video circuit constructed in accordance with the teachings of this invention.

FIG. 1 is a block diagram of one embodiment of a circuit 100 constructed in accordance with the teachings of this invention which serves as a transconductance amplifier which receives a digital or composite video input signal $V_{IN1}$, $V_{IN2}$ and controls CRT 2 via CRT driver circuitry 300, which in turn is driven by currents $I_{O1}$ and $I_{O2}$. However, it is to be understood that this invention is suitable for applications other than those which use video signals, for example, in other wideband applications, or in any application where a predominantly capacitive load is to be driven by relatively large voltage swings at high frequencies.

Referring now to FIG. 1, circuit 100 receives input signals $V_{IN1}$ and $V_{IN2}$ related to a video signal and provides output signals $I_{O1}$ and $I_{O2}$ suitable for controlling CRT driver 200. Circuit 100 includes input transconductance amplifiers g1, g2 suitable for receiving signals defining the video pattern to be displayed.

As shown in FIG. 1, the use of two input terminals for receipt of video input signals $V_{IN1}$ and $V_{IN2}$ allows the circuit of FIG. 1 to operate by receiving analog video signals (for example, RS-170 voltage levels) as input signal $V_{IN1}$, at which time input signal $V_{IN2}$ is grounded. When operating in the "analog" mode, the analog input signal applied to transconductance amplifier g1 has a value from 0 to 1.1 volts peak-to-peak. This analog video input voltage is amplified by transconductance amplifier g1 to provide a current to black level clamp/peak detector 101. Black level clamp/peak detector 101 receives from the video source a blanking/black level clamp signal (often referred to as a "sandcastle pulse") which serves to gate off the video signal during blanking, thereby providing a black level output signal to limiter L1. Black level clamp/peak detector 101 also includes a black level clamp terminal for connection to a "hold" capacitor needed in order to perform the black level clamp in the manner described, for example, in U.S. Pat. No. 3,869,568. The black level clamp serves to define the signal level associated with the color black. In one embodiment, with a 22 nF capacitor connected to the black level clamp terminal, and a minimum horizontal scanning frequency of approximately 15 KHz, the CRT cathode reference to droop will not exceed 0.15 volts, thereby minimizing the change in brightness on the CRT due to such droop in the CRT cathode voltage which is not caused by a desired change in the brightness of the CRT.

Circuit 101 also includes a SYNC output terminal. This terminal provides a TTL open collector output signal indicative of the SYNC signal contained in the input video signal. The SYNC output signal is low when the analog input signal $V_{IN1}$ is less than the black level (VREF), and is a logical one when the analog input signal $V_{IN1}$ is greater than VREF. In one embodiment of this invention, where three circuits as shown in FIG. 1 are used in a color system, the horizontal and vertical synchronization signals may appear on any of the three (red, green, and blue) analog video signals, and thus the three SYNC output terminals are tied together in a wired OR configuration in order to provide a single terminal capable of providing a SYNC signal, regardless of which color video signal originated the SYNC signal. Black level clamp/peak detector circuit 101 serves to separate the SYNC signal from the video input signal, and gate the video signal which has been stripped of SYNC, during blanking.

Circuity 101 also provides an output signal to limiter L1, which serves to limit the output signals for input signal swings greater than TTL logic level swings of 1.2 volts, and thus allow the circuit to function with TTL input signals. In turn, the output signal from limiter L1 is applied to one input lead of summer S1. As previously described, when $V_{IN1}$ is an analog video signal, $V_{IN2}$ is held at ground, and thus transconductance amplifier g2 provides no current to summer S1. Thus, the output signal from summer S1 is equal to the current provided by limiter L1 in response to the analog input signal $V_{IN1}$.

In contrast, when both input signals $V_{IN1}$ and $V_{IN2}$ are used to provide a 2-bit TTL video signal, transconductance amplifiers g1 and g2, and circuit 101, limiter L1, and summer S1 serve as a 2-bit- digital-to-analog converter. In this mode, transconductance amplifiers g1 and g2 either provide current (i.e., when their respective input signals are a TTL high), or no current (when their respective TTL input signals are low). In this mode, the four states defined by the two TTL input signals $V_{IN1}$ and $V_{IN2}$ represent four display intensities, such as 0% (black), 33%, 66%, and 100% (white).

Alternatively, any suitable means may be used to provide an analog video signal (with SYNC removed) to input lead 103 of multiplier M1.

In one embodiment, limiter L1 is formed as disclosed in copending U.S. patent application Ser. No. 199063, concurrently filed on an invention of Blauschild entitled "Unity-Gain Current-Limiting Circuit," now U.S. Pat. No. 4,851,759. Transconductance amplifiers g1 through g7 have a minimum −3 dB bandwidth of approximately 200 MHz, and can be formed as taught in copending U.S. patent application Ser. No. 115,136, filed Oct. 30, 1987.

The output current of contrast transconductance amplifier g4 provides a fixed DC current offset which is applied to the other input lead of current multiplier M1. Current multipliers M1 and M2 may advantageously be constructed in the manner taught in the above-mentioned copending U.S. patent application Ser. No. 115,136. The output current from current multiplier M1 is applied to one input lead of current summer S2. The output current from brightness transconductance amplifier g3 is applied to the other input lead of summer S2, thereby causing summer S2 to provide a current equal to the sum of the currents from multiplier M1 and brightness transconductance amplifier g3. This current output from summer S2 is applied to one input lead of current multiplier M2.

Transconductance amplifier g5 receives a subcontrast voltage $V_{subcontrast}$, which is used to weight the red, green, and blue guns relative to one another, when three independent circuits 1 are used in a color system. The output current from subcontrast transconductance amplifier g5 is applied to the other input lead of current multiplier M2. The output current from current multiplier M2 is applied to blank/shutdown circuit 102. Blank/shutdown circuit 102 receives an input TTL signal which, when low, disables the current applied to one input lead of summer S3, thereby disabling output amplifiers g8 and g9. Transconductance amplifier g6 receives a feedback signal in response to the voltage applied to CRT 2 reaching a desired level, as is explained in more detail later. The sum of the currents input to current summer S3 is applied to one input lead of current summer S4, which receives another current input from black level transconductance amplifier g7, which operates in response to a black level input voltage, which is adjusted such that the CRT cathode potential is just at beam cutoff, thereby causing any incremental positive voltage change of either video input signals $V_{IN1}$ or $V_{IN2}$, or the brightness control voltage $V_{brightness}$, to produce a beam current, illuminating the CRT display. The output current from current summer S4 is applied to the input leads of inverting amplifier g8 and noninverting amplifier g9, which in turn control output currents $I_{O1}$ and $I_{O2}$ via transistors Q1 and Q2, respectively. Amplifiers g8 and g9 also receive a slew limit signal, which sets the maximum output currents $I_{O1}$ and $I_{O2}$ available from transistors Q1 and Q2, respectively.

Figure 2:
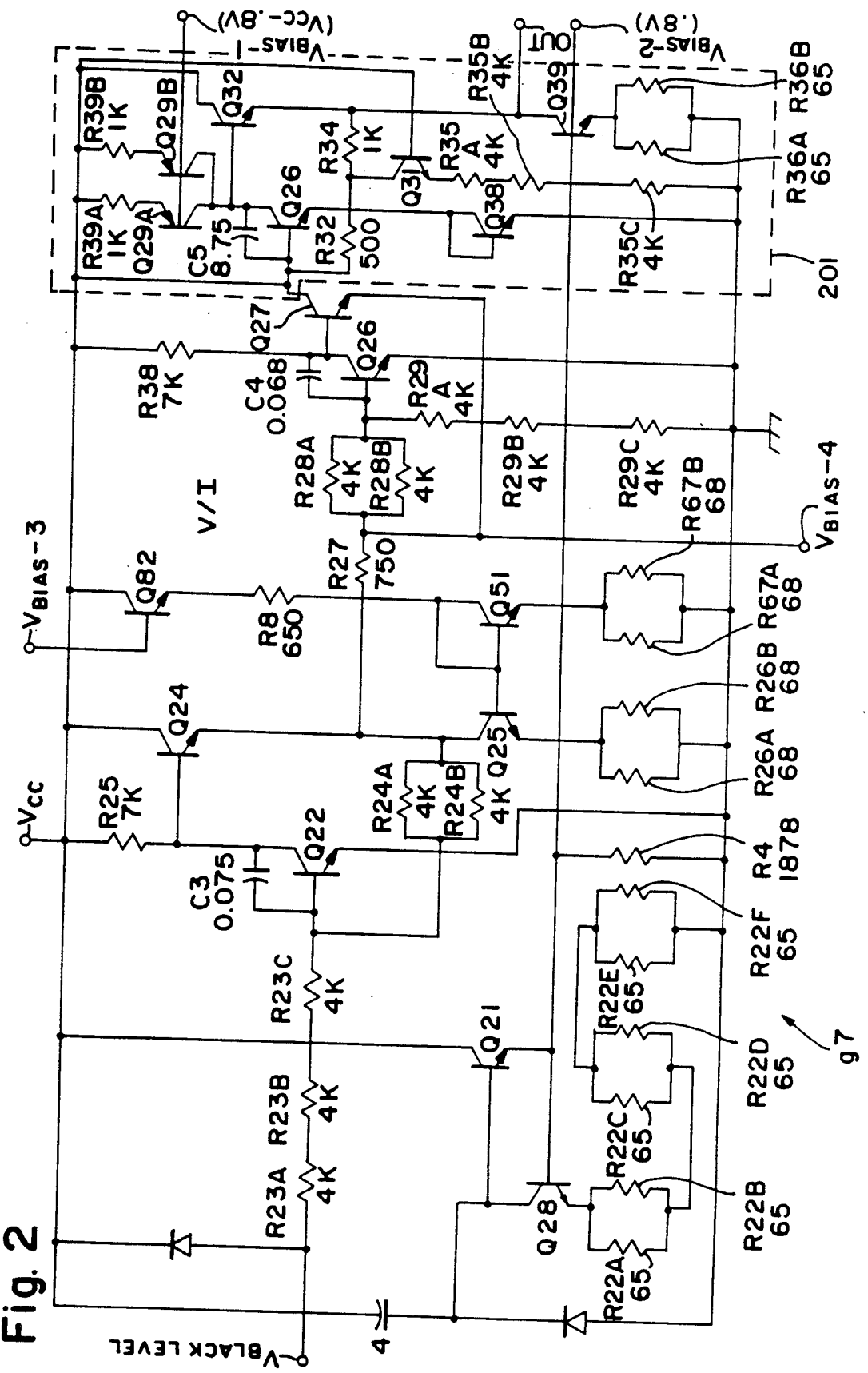
FIG. 2 is a schematic diagram of one embodiment of transconductance amplifier g7 of FIG. 1.

In one embodiment, transconductance amplifier g7 is fabricated as taught in U.S. Ser. No. 115,136, but includes an additional output gain stage 201, as shown in the schematic diagram of FIG. 2, which serves to invert the polarity of the output signal.

Figure 3:
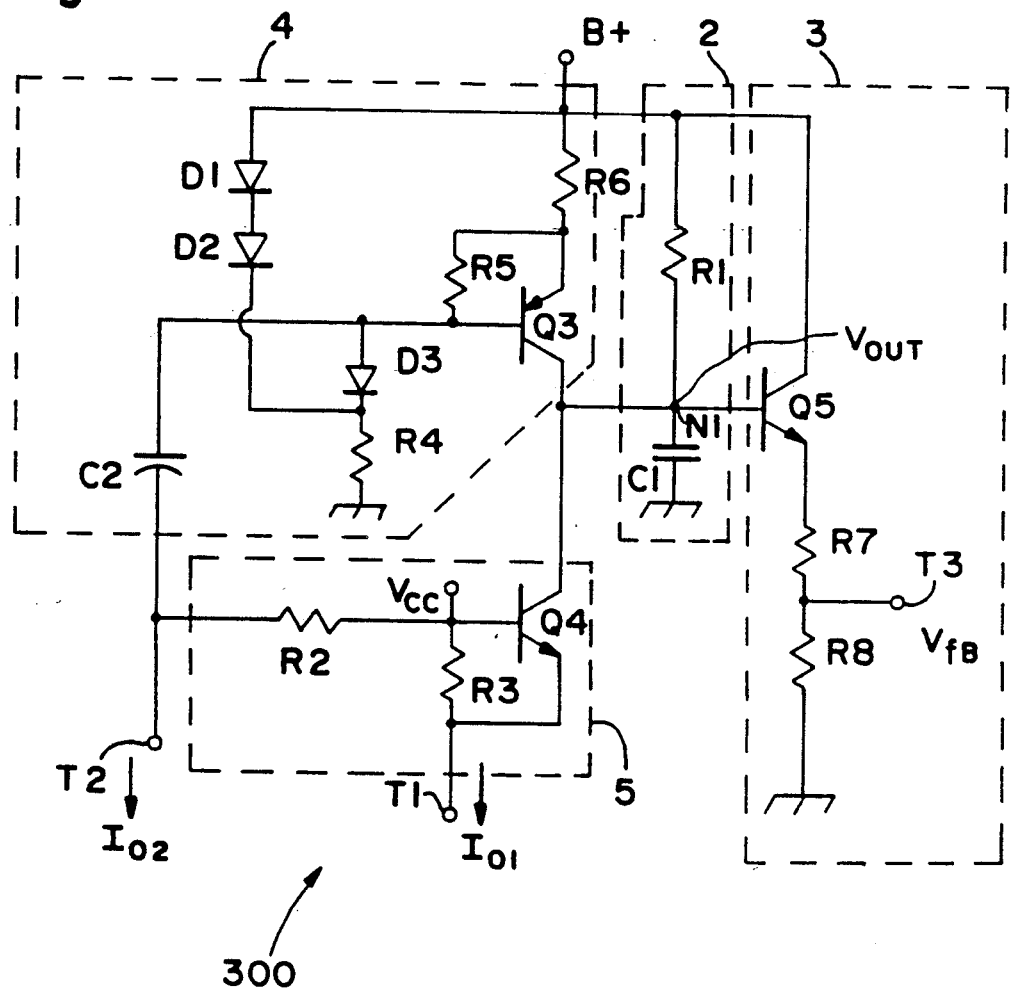
FIG. 3 is a schematic diagram of one embodiment of CRT driver circuitry 300 of FIG. 1.

FIG. 3 is a schematic diagram of one embodiment of circuit 300 which is constructed in accordance of the teachings of this invention. Of importance, the schematic diagram of FIG. 3 shows subcircuit 2 which includes capacitance C1 which in reality comprises the capacitance (typically approximately 9 pF) associated with the cathode of a CRT being driven which includes the CRT cathode capacitance (typically 5.5 pF to 7.0 pF) as well as some parasitic capacitance from the printed circuit board containing circuit 300. The output voltage $V_{OUT}$ is applied to the cathode of the CRT as shown. In accordance with the teachings of this invention, resistor R1 has a value of approximately 15K, thereby reducing the overall power consumption of this circuit as compared with prior-art class A devices, wherein a pull-up resistor corresponding to resistor R1 of FIG. 3 has a much lower value, for example on the order of 800 to 1.9K ohms. Such prior-art class A amplifiers have a relatively low value pull-up resistor in order to achieve the high frequency response necessary for amplifying the input signals. In contrast to the prior art, in accordance with the teachings of this invention, a relatively large value pull-up resistor R1 is used to minimize average power consumption, while utilizing transient pull-up circuit 4 and transient pull-down circuit 5 to achieve the high frequency response while minimizing average power consumption.

Transient pull-down subcircuit 5 receives CRT driver current $I_{O1}$ on terminal T1, which is used to drive NPN pull-down transistor Q4 in the cascode mode of operation, thereby allowing the circuit to obtain a bandwidth substantially equal to the $F_t$ of transistor Q4 (typically on the order of 200 MHz). In other words, transistor Q4 is biased by VCC (typically 5 volts) applied to its base, and its emitter is connected to its base via resistor R3 (approximately 45 ohms), which serves to bias CRT driver current $I_{O1}$ on terminal T1 to a suitable standby value (typically 10 to 20 mA). This insures that transistor Q4 always remains at least slightly turned on, avoiding a turn-on delay. In this manner, with an increasing $I_{O1}$ current (and thus decreasing $I_{O2}$ current), transistor Q4 is turned on harder, drawing up to approximately 100 mA of collector current through transistor Q4 from CRT output node N1, thereby discharging CRT capacitance C1 and decreasing $V_{OUT}$. Of importance, transistor Q4 is operated in the cascode mode, thereby allowing the frequency response of transistor Q4 to substantially equal the $F_t$ of transistor Q4, without degradation in the frequency response due to the base capacitance of transistor Q4 or complication in the drive circuitry, as would be the case if transistor Q4 were driven by a signal applied to its base.

Conversely, when $I_{O1}$ decreases (and $I_{O2}$ increases) the current through the emitter of transistor Q4 is decreased, decreasing the collector current of transistor Q4, and thus tending not to discharge capacitor C1, thereby increasing $V_{OUT}$.

Transient pull-up subcircuit 4 serves to provide additional pull-up current to charge capacitor C1 when it is desired to increase $V_{OUT}$. This subcircuit serves to provide a high frequency response which is not available utilizing pull-up resistor R1 alone. Diodes D1, D2, D3, and resistor R4 (typically 100K) hold the base of PNP pull-up transistor Q3 at approximately one diode drop below the B+ voltage (typically 115 volts DC). This ensures that transistor Q3 is always on at least slightly, with its minimum collector current being approximately 100 microamps, thereby avoiding a turn-on delay. By biasing pull-up transistor Q3 in this manner, turn-on delay is significantly reduced, thereby enhancing the frequency response of pull-up circuit 4. Resistor R5, connected between the emitter and base of transistor Q3 has a value of approximately 1.2K ohms and serves to provide a known current (typically 0.5 mA) through diode D3 to give diode D3 a well defined current and thus a substantially fixed voltage.

An AC current mirror formed by transient pull up transistor Q3, with resistors R5 and R6 (typically 30 ohms). Diodes D1, D2, D3, capacitor C2 and resistor R4 form a level shifting circuit. Increases in current $I_{O2}$ are coupled to the base of transistor Q3 via capacitor C2 (typically 1000 pF), thereby causing PNP pull-up transistor Q3 to turn on in a unity gain current mirror arrangement. This causes a uni-directional significant amount of current (typically approximately 100 mA) to be applied to output node N1, thereby increasing $V_{OUT}$. Conversely, when $I_{O2}$ decreases, transistor Q3 turns off, with its emitter current being reduced to the aforementioned level of approximately 100 microamps.

Figure 4:
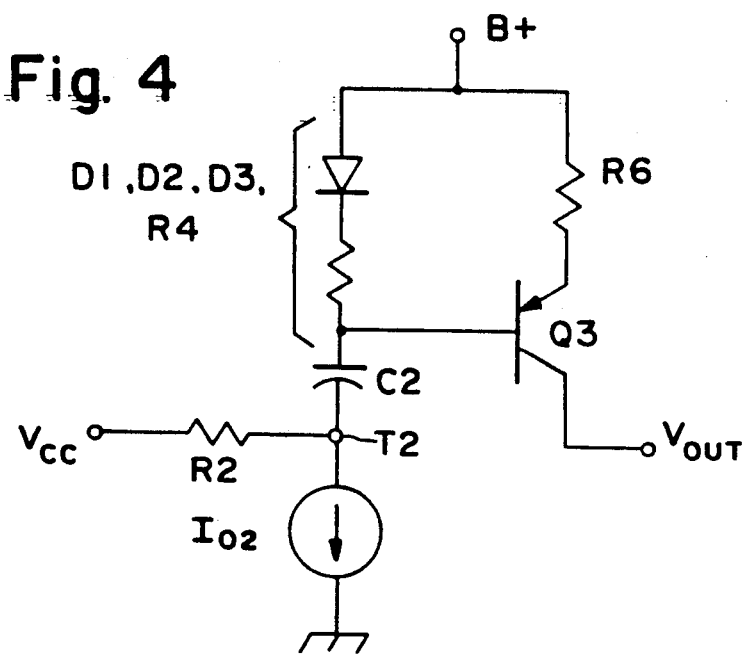
FIG. 4 is a simplified model of PNP transistor Q3 operated as a current mirror.

By operating transient pull-up subcircuit 4 in a manner which allows transistor Q3 to be driven as a current mirror configuration, the frequency response of pull-up subcircuit 4 is substantially the same as the $F_t$ of transistor Q3 (typically on the order of 200 MHz). FIG. 4 is a simplified model of PNP transistor Q3 operated as an AC current mirror. Diodes D1, D2, and D3 are connected to operate as the equivalent of a single diode which biases the base of PNP pull-up transistor Q3 on slightly to provide a desired standby current (typically 100 μA), thereby avoiding turn-on delay of transistor Q3. Since VCC is constant, when input current $I_{O2}$ increases, the change in voltage on input terminal T2 is equal to $$\Delta V_{T2} = \Delta I_{O2} R_2; \qquad (1)$$

where $\Delta V_{T2}$ = the change in voltage on input terminal T2;
$\Delta I_{O2}$ = the change in input current $I_{O2}$; and
$R_2$ = the resistance of resistor R2.

This $\Delta V_{T2}$ is coupled through coupling capacitor C2 to the base of PNP pull-up transistor Q3. Since the transient pull-up current through resistor R2 (30 ohms) is approximately 100 mA, the transient pull-up voltage across resistor R2 is approximately 3 volts. During the change in collector current of transistor Q3 from an idle current of approximately 100 μA to a transient pull-up current of approximately 100 μA, the change in the base-emitter voltage of transistor Q3 is approximately 180 mV. This is quite small compared to the 3 volt transient across resistor R2, and thus the base-emitter voltage of transistor Q3 can be assumed to be substantially constant. Then, since the base-emitter voltage of transistor Q3 is substantially constant, $\Delta V_{T2}$ is coupled to the emitter of transistor Q3, causing $$\Delta V_{R2} \approx \Delta V_{R6} \qquad (2)$$

Since $$I_{C3} \approx I_{R6}, \qquad (3) \text{ where}$$

$$\Delta I_{C3} \approx \Delta I_{R6}. \qquad (4)$$

Since $$\Delta V_{R6} = \Delta I_{R6} R_6; \qquad (5)$$

Then $$\Delta I_{C3} = \frac{\Delta V_{R6}}{R_6} \qquad (6)$$

Since $$R_2 \approx R_6, \qquad (7)$$

combining equations (6), (2), and (7), $$\Delta I_{C3} \approx \frac{\Delta V_{R2}}{R_2} \qquad (8)$$

and thus $$\Delta I_{C3} \approx \Delta I_{R2} \approx \Delta I_{O2}; \qquad (9)$$

where $\Delta V_{R2}$ is the change in voltage across resistor R2;
$\Delta I_{R2}$ is the change in current through resistor R2;
$\Delta V_{R6}$ is the change in voltage across resistor R6;
$\Delta I_{R6}$ is the change in current through resistor R6;
$R_6$ is the resistance of resistor R6;
$I_{R6}$ is the current flow through resistor R6; and
$I_{C3}$ is the collector current through transistor Q3.

Thus, the change in collector current through transistor Q3 is substantially equal to the change in input current $I_{O2}$, and thus PNP pull-up, transistor Q3 operates as an AC. current mirror, with the change in collector current of transistor Q3 mirroring the change in input current $I_{O2}$.

A significant advantage of this invention is that input currents $I_{O1}$ and $I_{O2}$ are easily supplied by fast, low voltage NPN transistors contained, for example, in an integrated circuit containing all of the video processing and control circuitry. These control currents $I_{O1}$ and $I_{O2}$ are then used to drive relatively inexpensive high voltage discrete transistors Q3 and Q4 in a current mirror and a cascode configuration, respectively, thereby allowing the $F_t$ of transistors Q3 and Q4 to be fully utilized.

Feedback subcircuit 3 provides a feedback signal $V_{fb}$ on terminal T3 which serves as the $V_{feedback}$ signal which is applied to circuit 100 of FIG. 1. The collector current through transistor Q5 is controlled by $V_{OUT}$ which is applied to the base of Q5. The collector current through Q5 is equal to $V_{OUT}/R_7 + R_8$) where $R_7$ is the resistance of resistor R7 and R8 is the resistance of resistor R8) thereby providing a related voltage $V_{fb}$. This feedback signal is used to cause currents $I_{O1}$ and $I_{O2}$ to operate essentially as pulses, with the pulses being ended when $V_{OUT}$ reaches its desired level. Once $V_{OUT}$ reaches the desired level, $I_{O1}$ provides a small steady state current which, in conjunction with resistor R1, fixes $V_{OUT}$ to a desired voltage level.

All publications and patent applications are herein incorporated by reference to the same extent as if each individual publication or patent application was specifically and individually indicated to be incorporated by reference. The invention now being fully described, it will be apparent to one of ordinary skill in the art that many changes and modifications can be made thereto without departing from the spirit or scope of the appended claims. For example, in alternative embodiments, pull-up subcircuit 4 includes a pull-up transistor driven in a cascode arrangement. In some embodiments, pull-down subcircuit 5 includes a pull-down transistor driven in a current mirror configuration. In all such embodiments, the bandwidth of the circuit is substantially the same as the $F_t$ of the discrete high voltage transistors used in the pull-up and pull-down subcircuits, since they are not driven by their bases.

We claim:

1. A wideband amplifier comprising:
   an input terminal for receiving an input signal to be amplified;
   an output terminal for providing an output signal as a function of said input signal;
   feedback means for providing a feedback signal in response to said output signal;
   control signal means for receiving said input signal and said feedback signal and, in response thereto, providing one or more control signals;
   an output stage for providing said output signal, said output stage including transient signal paths, each connected between said output terminal and an associated supply voltage, and each said transient signal path comprising a transistor driven in a manner which allows the bandwidth of said transient signal path to be substantially equal to the frequency $F_t$ of unity current gain of said transistor.

2. A wideband amplifier as in claim 1 wherein one of said transient signal paths comprises a transistor operated as an AC current mirror and the other of said transient signal paths comprises a transistor operated in the cascode mode of operation.

3. A wideband amplifier as in claim 1 wherein said bias voltage causes one of said transistors to never turn completely off.

4. A wideband amplifier as in claim 3 wherein said AC current mirror comprises:
   a transistor having a first current handling terminal connected to said output terminal, a second current handling terminal, and a control terminal;
   a first resistor means connected between said second current handling terminal and a supply voltage;
   biasing means connected between said control terminal and said supply voltage, said biasing means comprising a PN junction and a resistor; and means for coupling said input signal to said control means.

5. A wide band amplifier comprising:
input means for receiving an input signal to be amplified;
an output terminal for providing an output signal as a function of said input signal;
first transient means for providing a transient pull-up signal to said output terminal; and
second transient means, independent of said first transient means, for providing a transient pull-down signal to said output terminal,
wherein one of said transient means comprises a transistor operated in an AC current mirror configuration, and
said amplifier further comprises feedback means for controlling said input signal in response to said output signal.

6. A wideband amplifier comprising:
input means for receiving an input signal current to be amplified;
an output terminal for providing an output signal as a function of said input signal;
first transient means for providing a transient pull-up signal to said output terminal; and
second transient means, independent of said first transient means, for providing a transient pull-down signal to said output terminal,
wherein one of said transient means comprises a first transistor operated in an AC current mirror configuration for mirroring a component of said input signal current.

7. An amplifier as claimed in claim 6, wherein said AC current mirror configuration comprises:
a DC blocking capacitor; and
a branch having a first terminal connected to receive input signal current to be mirrored and a second terminal connected to a first supply voltage; and
said transistor has a first current handling terminal connected to a second supply voltage of substantially higher value than said first supply voltage, a second current handling terminal connected to said output terminal and a control terminal connected through said DC blocking capacitor to the first terminal of said branch.

8. An amplifier as in claim 6, wherein:
said first transistor has a first current handling terminal connected to said output terminal, a second current handling terminal, and a control terminal; and
said AC current mirror comprises a first resistor means connected between said second current handling terminal and a supply voltage;
biasing means connected between said control terminal and said supply voltage, said biasing means comprising a PN junction and a resistor; and
means for coupling said input signal to said control terminal.

9. An amplifier as in claim 6 wherein said transistor has a base connected to a source of bias potential which causes said transistor never to turn completely off.

10. An amplifier as in claim 6 wherein the other of said transient means includes a second transistor comprising:
a first current handling terminal connected to said output terminal;
a second current handling terminal connected to receive a current signal having a signal variation opposite to said input signal current; and
a control terminal connected to receive a bias voltage.

11. An amplifier as in claim 10, wherein each of said transistors has a base connected to a respective source of bias potential which causes each said transistor never to turn completely off.

12. An amplifier as in claim 11 wherein said transistor has a base connected to a source of bias potential which causes said transistor never to turn completely off.

13. An amplifier as in claim 10, wherein said second transistor is operated in the cascode mode of operation.

14. An amplifier as in claim 10, wherein said second transistor has a base connected to a source of bias potential which causes said transistor never to turn completely off.

* * * * *